(12) United States Patent
Uehara et al.

(10) Patent No.: US 7,591,899 B2
(45) Date of Patent: Sep. 22, 2009

(54) APPLICATOR DEVICE

(75) Inventors: Junichi Uehara, Otsu (JP); Takashi Iwade, Otsu (JP)

(73) Assignee: Toray Engineering Co., Ltd., Tokyo (JP)

( * ) Notice: Subject to any disclaimer, the term of this patent is extended or adjusted under 35 U.S.C. 154(b) by 426 days.

(21) Appl. No.: 11/387,865

(22) Filed: Mar. 24, 2006

(65) Prior Publication Data

US 2006/0219166 A1  Oct. 5, 2006

(30) Foreign Application Priority Data

Mar. 31, 2005 (JP) ............................. 2005-104393

(51) Int. Cl.
B05C 5/00 (2006.01)
B05B 13/02 (2006.01)
B05B 7/12 (2006.01)

(52) U.S. Cl. .................. 118/300; 118/305; 239/407; 239/568

(58) Field of Classification Search ............... 118/300, 118/305, 321, 323, 52, 612, 319, 320; 239/568, 239/407; 427/240; 417/507, 518, 395, 566, 417/571, 437, 569; 137/625.18
See application file for complete search history.

(56) References Cited

U.S. PATENT DOCUMENTS

| 5,403,169 | A | * | 4/1995 | Yokoi et al. | 417/568 |
| 6,398,527 | B1 | * | 6/2002 | Gram et al. | 417/398 |
| 6,419,462 | B1 | * | 7/2002 | Horie et al. | 417/394 |
| 2002/0048519 | A1 | * | 4/2002 | Spiteri-Gonzi et al. | 417/313 |
| 2003/0180471 | A1 | * | 9/2003 | Takekuma et al. | 427/421 |

FOREIGN PATENT DOCUMENTS

JP  H02-013184 U  1/1990
JP  2005-246201  9/2005

* cited by examiner

Primary Examiner—Yewebdar T Tadesse
(74) Attorney, Agent, or Firm—Global IP Counselors, LLP

(57) ABSTRACT

An applicator device comprises a reservoir tank trapping embrocation, a stage holding a substrate, a ferrule having a slit-shaped opening section above the stage, a fluid transfer pump guiding the embrocation within the reservoir tank to the ferrule, a first opening and closing valve between a suction opening of the fluid transfer pump and the reservoir tank, opening when a suction operation is carried out and closing when a discharge operation is carried out, a second opening and closing valve between a discharge opening of the fluid transfer pump and the ferrule, opening when a discharge operation is carried out and closing when a suction operation is carried out, and driving means relatively moving the ferrule and/or substrate when the slit-shaped opening section and the substrate are adjacent to one another, wherein the fluid transfer pump comprises a membranous sealing member sealing a gap between a cylinder and a plunger.

6 Claims, 8 Drawing Sheets

APPLICATOR DEVICE

TECHNICAL FIELD

The present invention relates to an applicator device, and more particularly, to an applicator device which is suitable for use in resist fluid application process, one of processes for manufacturing a liquid crystal substrate.

BACKGROUND ART

From the past, an applicator device illustrated in FIG. 8 is used in resist fluid application process, one of processes for manufacturing a liquid crystal substrate {refer to Japanese Patent Application No. 2004-058914 (Japanese Patent Laid-Open Publication No. 2005-246201)}. FIG. 8 is a configuration view of a conventional applicator device 20. Components, each component being similar to a component of an applicator device 1 according to the present invention described later, are given reference alphanumeric, each reference alphanumeric being the same to the reference alphanumeric given to the corresponding component of the applicator device 1.

As is illustrated in FIG. 8, the conventional applicator device 20 comprises a reservoir tank 4, a stage 5, a ferrule 6, a ferrule driving device 7, fluid transfer pump 80, a first opening and closing valve 11, a second opening and closing valve 12, a control device 30, and the like. In the applicator device 20, resist fluid is sucked through a suction opening 81, then discharged through a discharge opening 82, by closing the first opening and closing valve 11 and the second opening and closing valve 12 alternately, along with the reciprocating driving of a plunger P within the fluid transfer pump 80.

When discharge operation of resist fluid is carried out, resist fluid steeped out from the slit-shaped opening section 621 is applied on a surface of a glass substrate K, by making the ferrule 6 and the glass substrate K into adjacent condition to one another and by moving the ferrule 6 in X-direction by the ferrule driving device 7. The fluid transfer pump 80 of the applicator device 20 used an O-ring N as a sealing member for sealing gap G between a cylinder 83 and the plunger P.

DISCLOSURE OF THE INVENTION

Problems to be Solved by the Invention

When the fluid transfer pump 80 described above is employed, ablation of the O-ring is rapidly generated due to friction generated between the O-ring N and the cylinder 83. Also, particles may be generated due to the friction generated between the O-ring N and the cylinder 83. Therefore, problems arise such that the O-ring N must be exchanged with new one frequently, working cost and parts cost are expensive, and production efficiency is lowered due to respite of a production line.

The present invention was made in view of the above problems.

It is an object of the present invention to provide an applicator device which realizes a long lifetime of a sealing member used in a fluid transfer pump, the fluid transfer pump guiding embrocation to a ferrule.

Means for Solving the Problem

To solve the above problems, an applicator device 1 of an aspect 1 comprises a reservoir tank 4 for trapping embrocation, a stage 5 for holding a substrate K which is to be applied embrocation, a ferrule 6 having a slit-shaped opening section 621 and being installed above the stage 5, a fluid transfer pump 8 for guiding the embrocation within the reservoir tank 4 to the ferrule 6 by carrying out suction operation and discharge operation alternately, a first opening and closing valve 11 disposed between a suction opening C12 of the fluid transfer pump 8 and the reservoir tank 4 and becoming in opened condition when suction operation is carried out and becoming in closed condition when discharge operation is carried out, a second opening and closing valve 12 disposed between a discharge opening C13 of the fluid transfer pump 8 and the ferrule 6 and becoming in opened condition when discharge operation is carried out and becoming in closed condition when suction operation is carried out, and driving means 7 for relatively moving the ferrule 6 and/or substrate K to one another under a condition where the slit-shaped opening section 621 and the substrate K are adjacent to one another, wherein the fluid transfer pump 8 comprises a cylinder C having the suction opening C12 and the discharge opening C13, a plunger P provided within the cylinder C in reciprocable manner along an axial line J1 of the cylinder C, a membranous sealing member F for sealing gap G between the cylinder C and the plunger P, and plunger driving means PD for driving the plunger P.

In an applicator device 1 of an aspect 2, the membranous sealing member F consists of a cap-shaped member made of flexible material, wherein the plunger P is covered by a body section F3 of the cap-shaped member under the condition that an opening edge section F2 of the cap-shaped member is fixed on the inner peripheral face of the cylinder C, and wherein the gap G between the cylinder C and the plunger P is sealed by a U-shaped turn-back section F1 which is formed by downwardly turning back the membranous sealing member F within the gap G.

In an applicator device 1 of an aspect 3, a vacuum pump 9 is connected to a chamber R2 within the cylinder C, the chamber R2 being not in contact with fluid.

An applicator device 1 of an aspect 4 further comprises positive pressure imparting means 10 for imparting predetermined positive pressure within the reservoir tank 4.

In an applicator device 1 of an aspect 5, the plunger driving means PD drives the plunger P so as to determine a moving speed of the plunger P when suction operation is carried out, to be lower than a moving speed of the plunger when discharge operation is carried out. The embrocation is pressure feed in a fluid chamber of the fluid transfer pump 8. But, the embrocation is considered to be sucked by criteria of the fluid transfer pump 8. The recitation "suction operation" in the aspect 1 is employed here as it is.

In an applicator device 1 of an aspect 6, the plunger driving means PD drives the plunger P so as to determine a time-speed relationship at an acceleration beginning stage of the plunger P under suction operation to be a near S-curve shape. The embrocation is pressure feed in a fluid chamber of the fluid transfer pump 8. But, the embrocation is considered to be sucked by criteria of the fluid transfer pump 8. The recitation "suction operation" in the aspect 1 is employed here as it is.

In an applicator device 1 of an aspect 7, the discharge opening C13 is provided at the top section of the cylinder C of the fluid transfer pump 8, and is used in standing condition where the axial line J1 of the cylinder C is in parallel with a vertical axis.

An applicator device 1 of an aspect 8 further comprises an embrocation detection sensor D for detecting embrocation leaked through the membranous sealing member F, wherein the first opening and closing valve 11 is operated to be closed condition in response to a detection signal from the embrocation detection sensor D.

Effect of the Invention

The present invention realizes lengthening lifetime of the sealing member used within the fluid transfer pump in the applicator device, the fluid transfer pump guiding embrocation to the ferrule.

When the invention of aspect 1 or 2 is employed, a membranous sealing member F is used as the sealing member for sealing the gap G between the cylinder C and the plunger P, therefore ablation is small and particle generation is small.

When the invention of aspect 3 is employed, contact of the membranous sealing member F with the outer periphery face of the plunger P and the inner periphery face of the cylinder C becomes better by making the non-fluid chamber (vacuum chamber) R2 to be in vacuum condition. Therefore, no asperity, corrugation, or fold line are generated.

When the invention of aspect 4 is employed, pressure decrease within the fluid chamber R1 is compensated, the pressure decrease being generated when the plunger has moved to the side for carrying out suction operation, because the embrocation flowed into the fluid chamber R1 of the cylinder C is pressurized by the positive pressure imparting means 10. Therefore, unreasonable force is prevented from applying to the membranous sealing member F so that the lifetime of the membranous sealing member F is lengthened, because instantaneous pressure change having a greater changing rate is not generated within the fluid chamber R1 due to the compensation.

When the invention of aspect 5 or 6 is employed, instantaneous pressure change having a greater changing rate is not generated within the fluid chamber R1 because the plunger P is moved downwards slowly during the suction operation. Therefore, unreasonable force is prevented from applying to the membranous sealing member F so that the lifetime of the membranous sealing member F is lengthened.

When the invention of aspect 7 is employed, bubble is easily escaped through the discharge opening C13 so that conditions become extremely small such that bubble enters into the bottom section of the U-shaped turn-back section and remains as it is, bubble contacts the bottom section of the U-shaped turn-back section and remains as it is. Therefore, unreasonable force is prevented from applying to the membranous sealing member F so that the lifetime of the membranous sealing member F is lengthened.

When the invention of aspect 8 is employed, application operation is temporarily ceased when the membranous sealing member F is torn due to factors such as degradation over time. Therefore, it is prevented from occurrence that leaked resist fluid is sucked by the vacuum pump 9.

BEST MODE FOR CARRYING OUT THE INVENTION

Hereinafter, referring to the attached drawings, we explain the best mode for carrying out the present invention.

Figure 1:
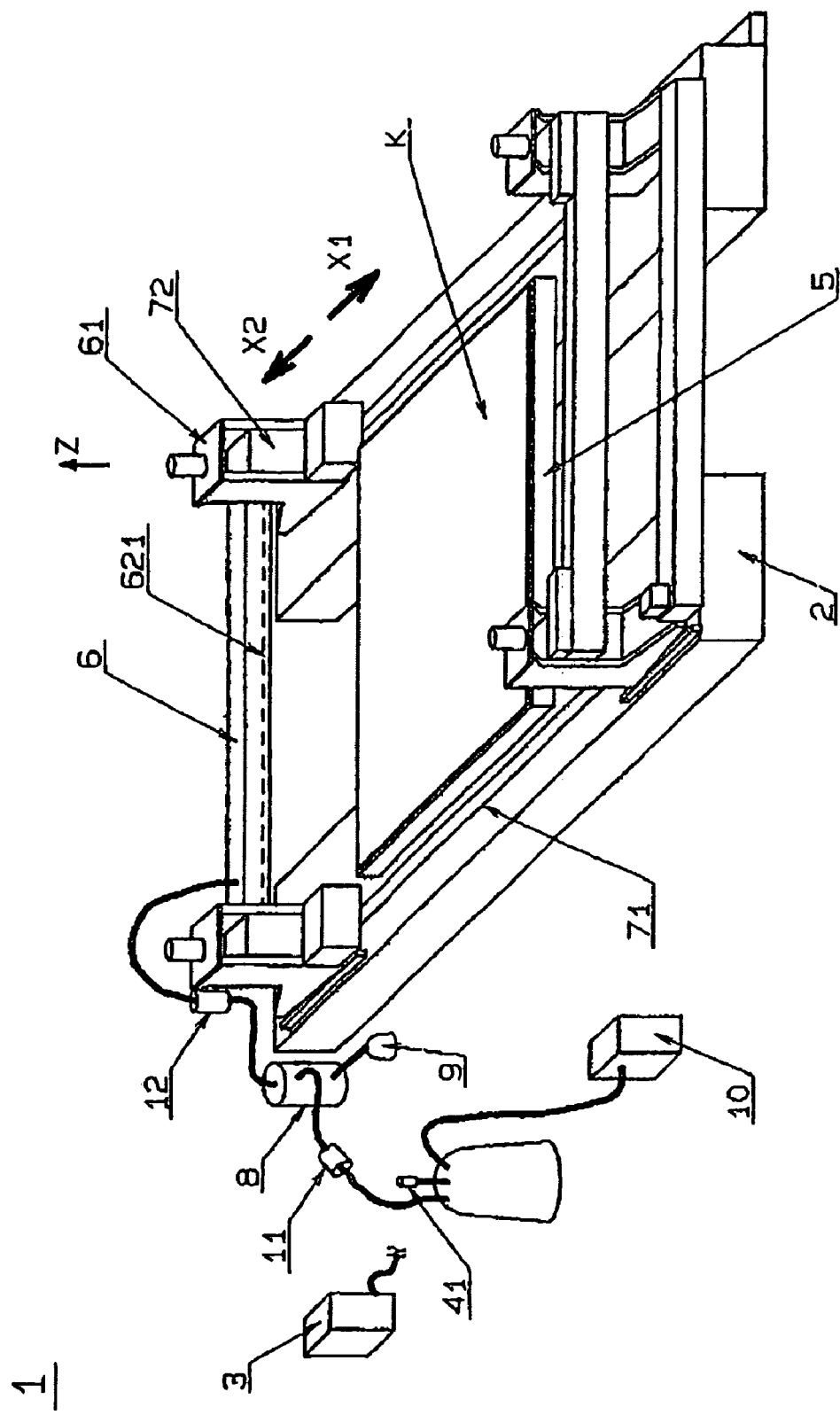
FIG. 1 is a perspective view illustrating exterior appearance of an applicator device according to the present invention.
Figure 2:
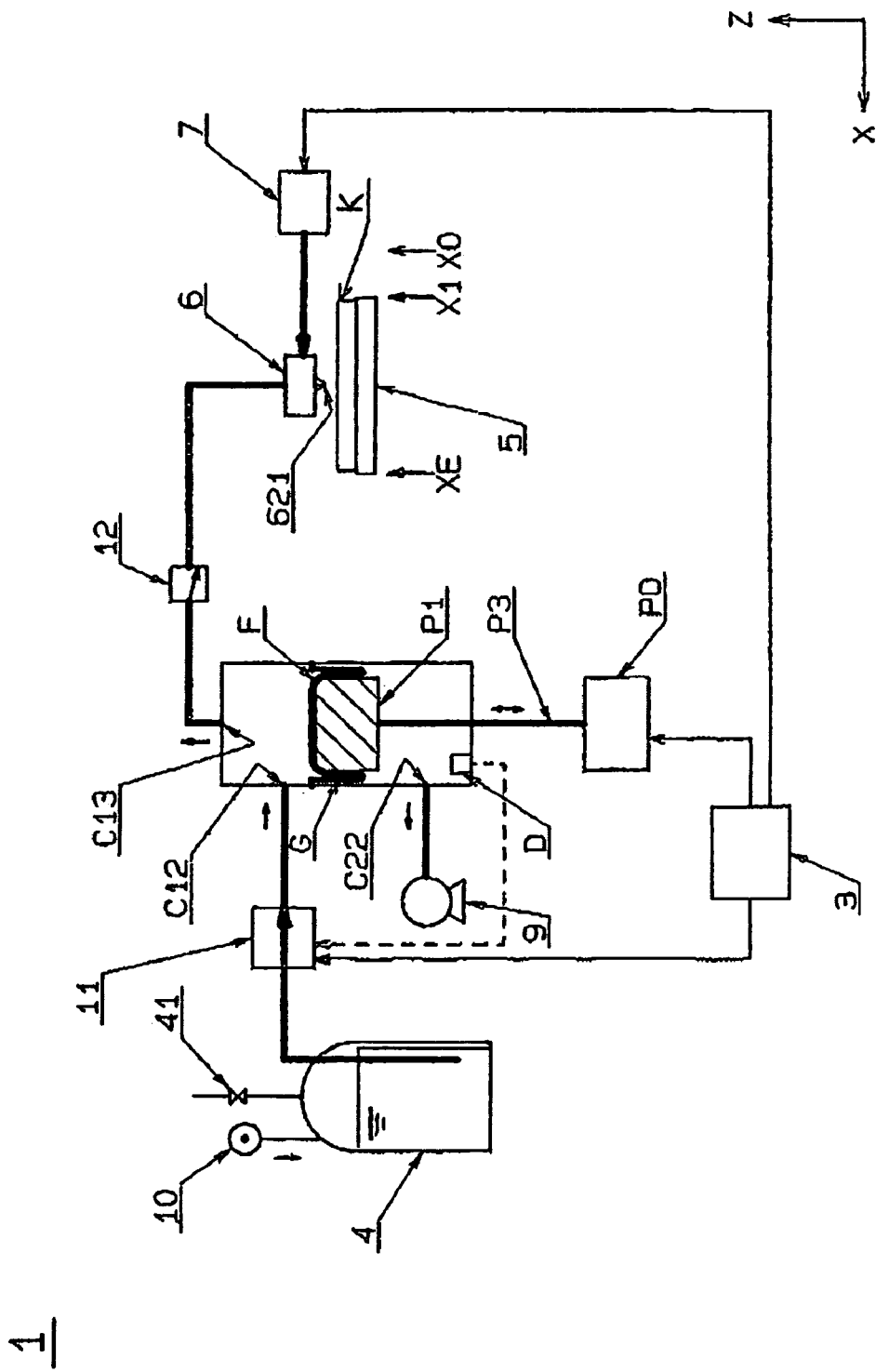
FIG. 2 is a construction view of the applicator device.
Figure 3:
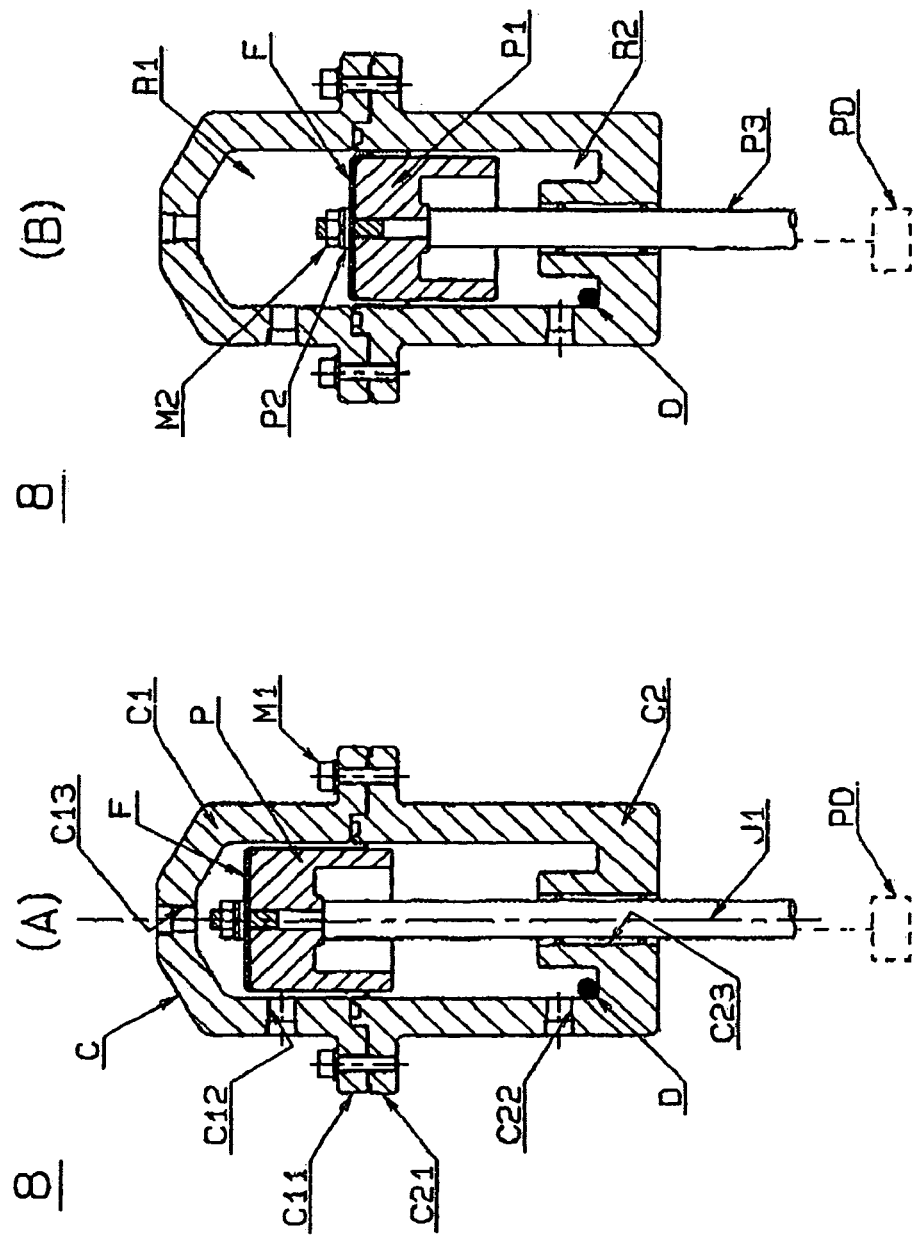
FIGS. 3 are partially cross-sectional front views of a fluid transfer pump.
Figure 4:
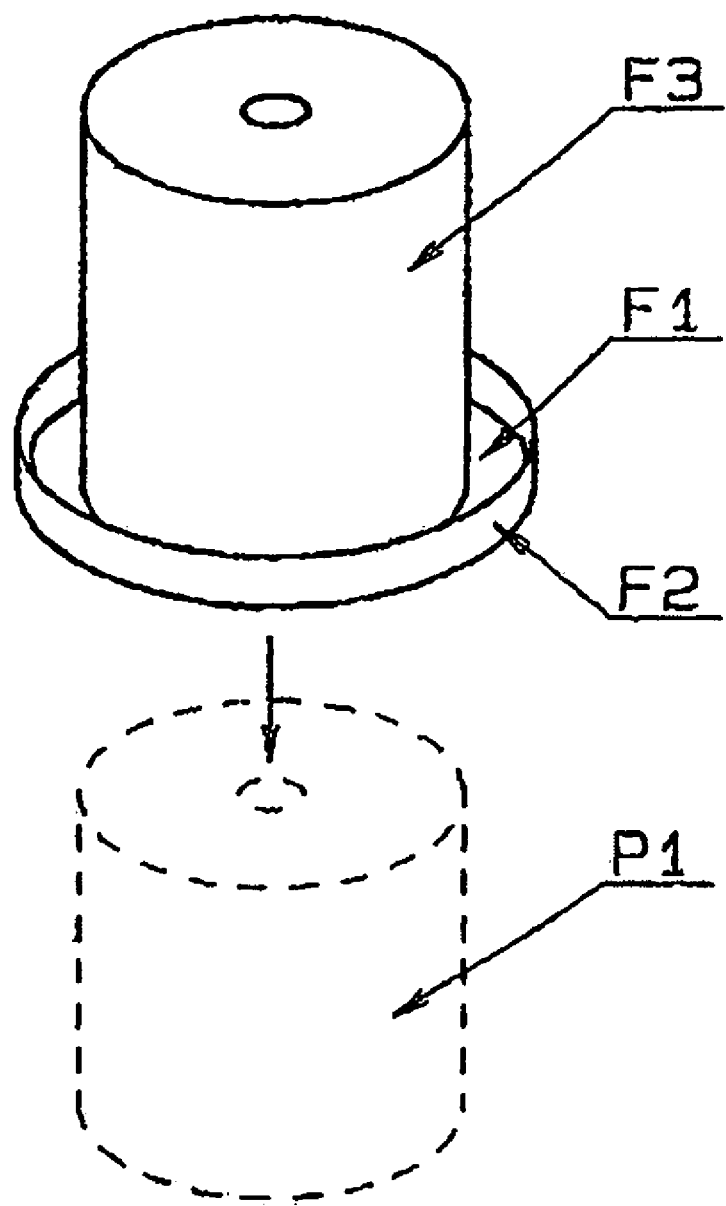
FIG. 4 is a perspective view illustrating exterior appearance of a membranous sealing member.
Figure 5:
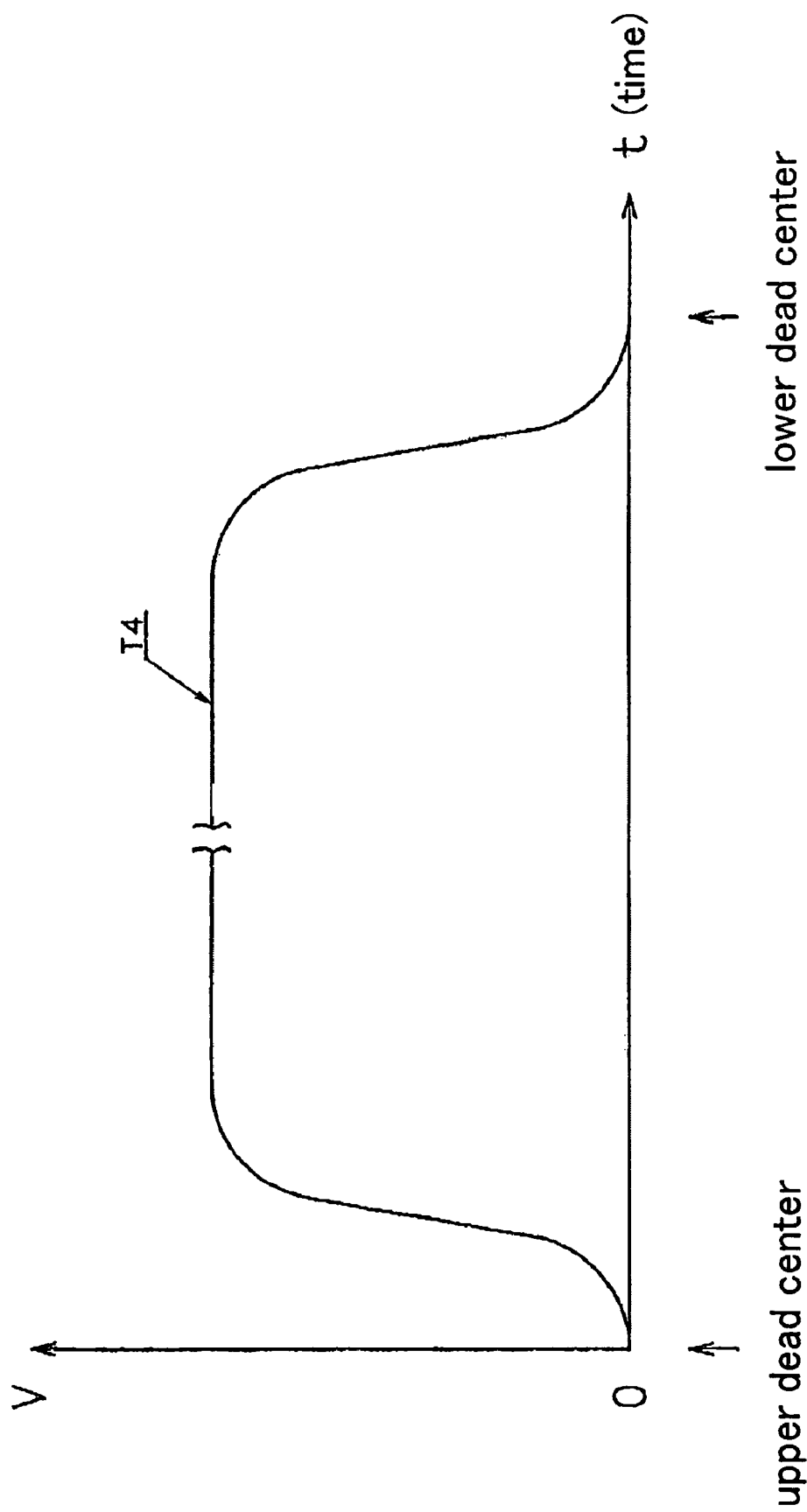
FIG. 5 is a graph representing a time-speed relationship when a plunger driving device drives a plunger from its upper dead center to its lower dead center.

FIG. 1 is a perspective view illustrating exterior appearance of an applicator device according to the present invention; FIG. 2 is a construction view of the applicator device; FIG. 3 are partially cross-sectional front views of a fluid transfer pump; FIG. 4 is a perspective view illustrating exterior appearance of a membranous sealing member; and FIG. 5 is a graph representing a time-speed relationship when a plunger driving device drives a plunger from its upper dead center to its lower dead center. Wherein, FIG. 3(A) illustrates a condition where the plunger P is at the lower dead center, and FIG. 3(B) illustrates a condition where the plunger P is at the upper dead center.

As is illustrated in FIGS. 1 and 2, an applicator device 1 comprises a base member 2, a control device 3, a reservoir tank 4, a stage 5, a ferrule 6, a ferrule driving device 7, a fluid transfer pump 8, a vacuum pump 9, a pressurizing pump 10, a first opening and closing valve 11, a second opening and closing valve 12, and the like. The applicator device 1 receives a glass substrate K from a robot (not shown) disposed at a transverse position with respect to the applicator device 1 (left side or right side with respect to the applicator device 1, in FIG. 1), and applies resist fluid onto the glass substrate K.

The base member 2 acts as a pedestal for supporting component sections of the applicator device 1, and is made of stone so as to minimize deformation of the base member due to temperature change.

The control device 3 may be a so called NC controller which controls operation of each component of the applicator device 1 based upon previously installed program so as to allow the applicator device 1 to carry out predetermined application operation.

The reservoir tank 4 may be a close tank for trapping a predetermined amount of resist fluid, and is connected to the pressurizing pump 10, an air release valve 41, and the first opening and closing valve 11 via piping. The interior of the reservoir tank 4 can be pressurized up to about 1.0 MPa by the pressurizing pump 10.

The stage 5 has a supporting face for supporting a glass substrate K objected for application with sufficient flatness, and is made of stone similarly to the base member 2. A number of small through holes are provided on the surface of the stage 5 for sucking and holding the glass substrate K. And, a plurality of lift pin are provided to the stage 5 in rising and setting manner with respect to the surface for moving the glass substrate K up and down when the glass substrate K is received or passed over.

The ferrule 6 may be made of rectangular column shaped metal body which is installed above the stage by a ferrule supporting section (gantry) 61. The ferrule 6 is formed a slit-shaped opening section 62 along the central longitudinal direction for exuding resist fluid.

The ferrule driving device 7 comprises a linear motor 71 provided to the base member 2, a linear servo motor 72 provided to the ferrule supporting section 61, and the like. The ferrule driving device 7 can linearly drive the ferrule in X and Y directions, respectively.

The fluid transfer pump 8 comprises a cylinder C, a plunger P, a membranous sealing member F, and a plunger driving section PD, and is used under a standing condition, that is the axial line J1 of the cylinder C is determined to be in parallel with the vertical axis.

The cylinder C comprises a nearly cup-shaped upper cover member C1 having an ear section C11, and a nearly cup-shaped lower cover member C2 having an ear section C21 similarly to the upper cover member C1. The upper cover member C1 and the lower cover member C2 are united together to form a cylinder main body by tightening up the ear sections C11 and C21 with a bolt M1 under a condition where the open edge section F2 of the membranous sealing member F is pinched between the respective ear section C11 and the ear section C21. A fluid chamber R1 is formed between the upper cover member C1 and the membranous sealing member F, and a vacuum chamber R2 is formed between the lower cover member C2 and the membranous sealing member F. A fluid detection sensor D is provided within the vacuum chamber R2 for detecting leakage of resist fluid.

In the upper cover member C1, a suction opening C12 and a discharge opening C13 are formed. The suction opening C12 is formed at the side section of the upper cover member C1 in parallel with the normal line direction thereof. The suction opening C12 is also formed within an extent where gap G between the cylinder C and the plunger P is formed when the plunger P reaches the upper dead center. The discharge opening C13 is formed at the top section of the upper cover member C1 in parallel with the axial line J1.

In the lower cover member C2, a vacuuming opening C22 and a rod hole C23 are formed. The vacuuming opening C22 is communicated to the vacuum pump 9 via piping. The rod hole C23 is a through hole for slidably passing through a rod P3 of the plunger P, and is formed at the bottom section of the lower cover member C2.

The plunger P comprises a head P1, a seat plate P2, and a rod P3. The head covered by the membranous sealing member F is connected to the rod P3 by the bolt M2 via the seat plate P2. The other end of the rod P3 which passes through the rod hole C23, is connected to the plunger driving device PD.

The membranous sealing member F is constituted of a cap-shaped member made of flexible material. Strong polyester cloth covered with rubber is used as the flexible material, for example. The membranous sealing member F seals the gap G in the following manner. That is, the upper section of the plunger P is covered with the body section F3 of the cap-shaped member under a condition where the open edge section F2 of the cap-shaped member is fixed to the inner periphery face of the cylinder C. Then, U-shaped turn-back section F1 having U-shape in cross section is formed by turning back the cap-shaped member downward in the gap G between the cylinder C and the plunger P. The U-shaped turn-back section F1 seals the gap G. The U-shaped turn-back section F1 moves within the gap G with the reciprocating driving of the plunger P, the moving direction being the same to the driving direction. The U-shaped turn-back section F1 moves within the gap G in a turn over manner. Therefore, scarce ablation losses are generated, and no leakage of fluid or gas is generated.

The plunger driving device PD comprises a servo motor having a rotary drive shaft, and a ball screw for transforming rotary motion of the rotary drive shaft into linear motion. Operation of the plunger driving device PD may be controlled by program installed in the control device 3. The plunger driving device PD is controlled so that the time-speed relationship becomes nearly S-shaped curve when the plunger P is driven from the upper dead center towards the lower dead center, as is illustrated in FIG. 5.

The first opening and closing valve 11 is provided between the reservoir tank 4 and the suction opening C12 of the fluid transfer pump 8, and is controlled so that the first opening and closing valve 11 becomes opened condition when the fluid transfer pump 8 carries out suction operation and becomes closed condition when the fluid transfer pump 8 carries out discharge operation. The first opening and closing valve 11 is also controlled so that the first opening and closing valve 11 becomes closed condition in response to a signal which is generated when the fluid detection sensor D detects resist fluid. The second opening and closing valve 12 is provided between the ferrule 6 and the discharge opening C13 of the fluid transfer pump 8, and is controlled so that the second opening and closing valve 12 becomes closed condition when the fluid transfer pump 8 carries out suction operation and becomes opened condition when the fluid transfer pump 8 carries out discharge operation.

Next, application operations of the applicator device 1 having the above arrangement is described.

Figure 6:
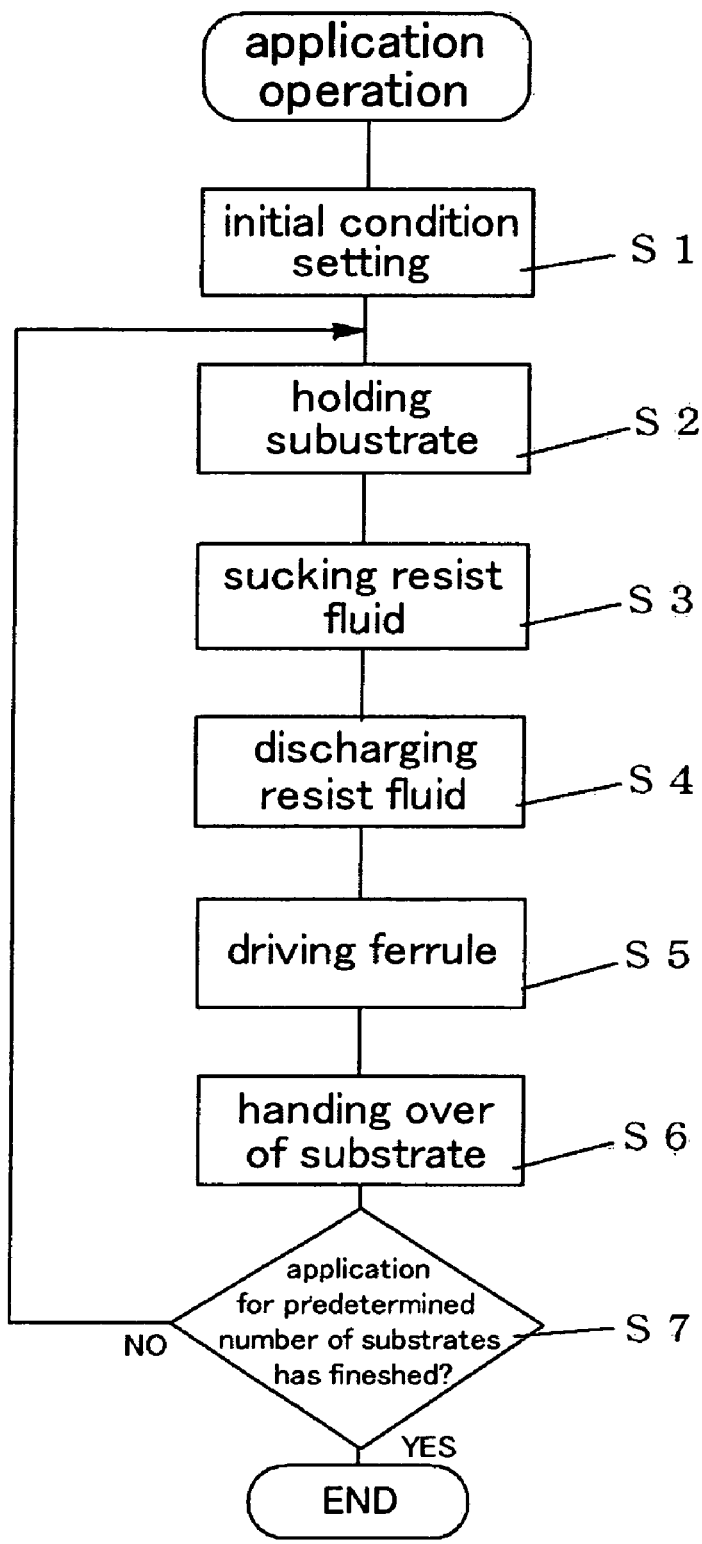
FIG. 6 is a flowchart useful in understanding procedure of application operations.
Figure 7:
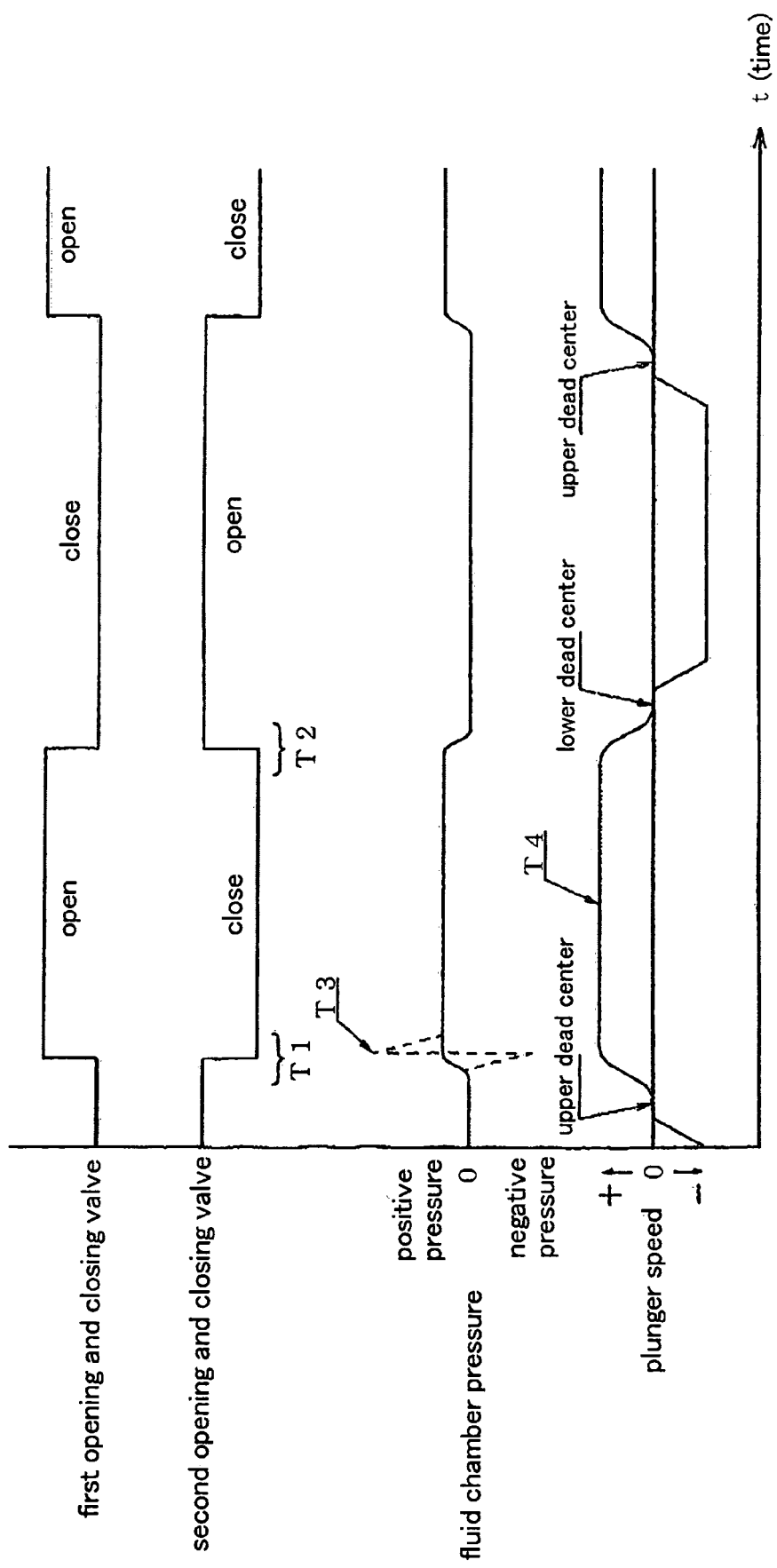
FIG. 7 is a graph representing a relationship between opening and closing conditions of a first opening and closing valve and a second opening and closing valve during application operation, a pressure within a fluid chamber, and a speed of a plunger.
Figure 8:
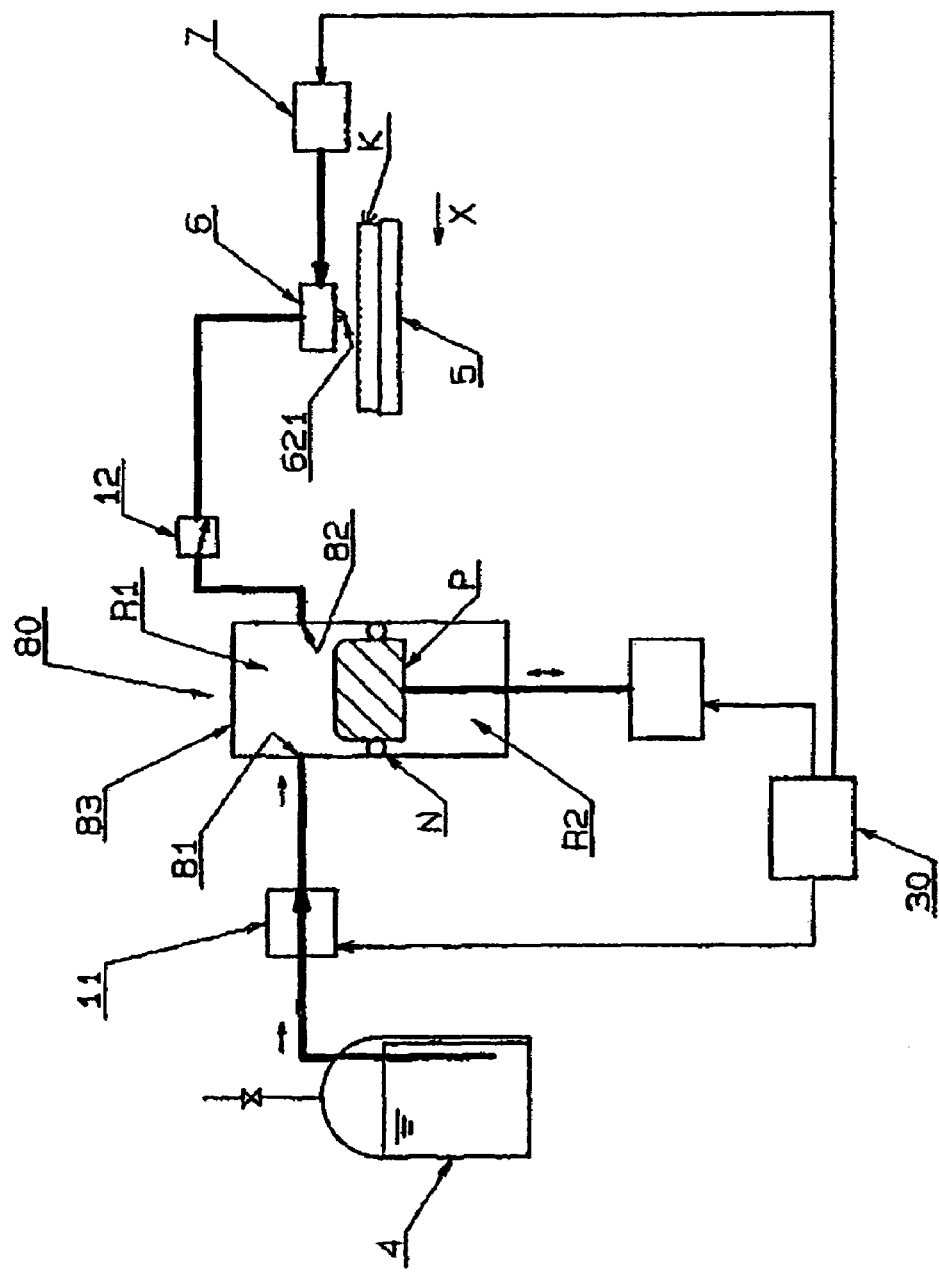
FIG. 8 is a construction view of a conventional applicator device.

FIG. 6 is a flowchart useful in understanding procedure of application operations. FIG. 7 is a graph representing a relationship between opening and closing conditions of a first opening and closing valve and a second opening and closing valve during application operation, a pressure within a fluid chamber, and a speed of a plunger. In FIGS. 5 and 7, the horizontal axis is a time axis, and a speed in a moving direction of the plunger P from the upper dead center towards the lower dead center is determined to be positive.

As is illustrated in FIG. 6, application operations are carried out by an initial condition setting step S1, a substrate holding step S2, a fluid sucking step S3, a fluid discharging step S4, a ferrule driving step S5, and a substrate passing over step S6.

In the initial condition setting step S1, resist fluid trapped within the reservoir tank 4 is pressurized up to about 0.1 MPa by the pressurizing pump 10, and air release is carried out for a predetermined time period by the air releasing valve 41. the vacuum chamber R2 of the fluid transfer pump 8 is reduced its pressure to about 80 kPa through the vacuum pump 9. By making the vacuum chamber R2 to be nearly vacuum condition, contact of the membranous sealing member F with the outer periphery face of the head P1 and the inner periphery face of the cylinder C becomes better, thereby no asperity, corrugation, or fold line are generated in the U-shaped turn-back section F1.

In the substrate holding step S2, the stage 5 raises lift pins, and receives a glass substrate K conveyed by a robot. Then, the stage 5 lowers the lift pins, and sucks and holds the glass substrate K on the stage 5 by generating negative pressure within sucking holes (small through holes).

In the fluid sucking step S3, the second opening and closing valve 12 becomes closed condition by an instruction from the control device 3, then the first opening and closing valve 11 becomes opened condition, as is illustrated in T1 portion in FIG. 7. Then, the plunger driving device PD drives the plunger P from the upper dead center towards the lower dead center. During this operation, resist fluid flows into the fluid chamber R1 from the suction opening C12 via the first opening and closing valve 11.

Inflow resist fluid is pressurized by the pressurizing pump 10, thereby pressure decrease within the fluid chamber R1 due to downward moving of the plunger P is compensated. Therefore, rapid pressure change within the fluid chamber R1 is not generated. Consequently, unstable shape change is not generated in the U-shaped turn-back section F1 of the membranous sealing member F. The U-shaped turn-back section F1 moves the gap G under a condition where the U-shaped turn-back section F1 maintains good U-shape. Therefore, unreasonable force is prevented from applying to the membranous sealing member F so that the lifetime of the membranous sealing member F is lengthened.

When resist fluid is not pressurized by the pressurizing pump 10, the U-shaped turn-back section F1 becomes unstable shape due to rapid pressure change within the fluid chamber R1. For example, at the instant the plunger P has begun moving downwardly, resist fluid does not flow into the fluid chamber R1 right now due to its inertia, thereby the phenomenon appears such that the pressure within the fluid chamber R1 is suddenly lowered at once, and is suddenly raises immediately after that (refer to dashed line of T3 portion in FIG. 7). The pressure difference between the fluid chamber R1 and the vacuum chamber R2 becomes temporarily small due to the phenomenon, thereby asperity, corrugation, fold line or the like are generated in the U-shaped turn-back section F1. The deformed portion once formed in such manner is difficult to be restored, ablation and cracks are finally generated in the portion following the increase in the number of reciprocating movement of the plunger P, thereby the deformed portion becomes a greater factor for shortening the lifetime of the membranous sealing member F.

The plunger driving device PD drives the plunger P in the acceleration characteristic such as the characteristic illustrated in FIG. 5 when the plunger driving device PD drives the plunger P from the upper dead center towards the lower dead center. That is, the time-speed relationship in the acceleration beginning stage is determined to be nearly S-shaped curve. The downward moving speed of the plunger P is smaller than the upward moving speed, and the downward moving acceleration is smaller than the upward moving acceleration, and the plunger downward moves slowly accordingly, thereby instantaneous pressure change having a greater changing rate is not generated in the fluid chamber R1.

Therefore, unstable shape change is not generated in the U-shaped turn-back section F1 of the membranous sealing member F. The U-shaped turn-back section F1 moves within the gap G under a condition where the U-shaped turn-back section F1 maintains good U-shape. Therefore, unreasonable force is prevented from applying to the membranous sealing member F so that the lifetime of the membranous sealing member F is lengthened.

When the plunger P beginning acceleration reaches a predetermined speed, the speed is maintained for a predetermined time period, as is illustrated in T4 portion in FIGS. 5 and 7. The time-speed relationship in deceleration beginning stage when the plunger P comes close to the lower dead center, is determined to be a near S-shaped curve which is symmetric to the near S-shaped curve in acceleration beginning stage.

In the fluid discharging step S4, the first opening and closing valve 11 firstly becomes closed condition by the instruction from the control device 3, then the second opening and closing valve 12 becomes opened condition, as is illustrated in T2 portion in FIG. 7. The plunger driving device PD drives the plunger P from the lower dead center towards the upper dead center, thereby resist fluid is discharged from the discharge opening C13. When the plunger P moves from the lower dead center towards the upper dead center, the time-speed relationship in the acceleration beginning stage is determined to be a straight line shape having a constant gradient. When a speed of the plunger P reaches a predetermined speed, the plunger P maintains the speed for a predetermined time period. The time-speed relationship in deceleration beginning stage when the plunger P comes close to the upper dead center, is determined to be a straight line shape having a constant gradient which is symmetric to the straight line shape in acceleration beginning stage. The resist fluid discharged from the discharge opening C13 is guided to the ferrule 6 via the second opening and closing valve 12.

Air bubbles within the fluid chamber R1 are easily escaped through the discharge opening C13, because the discharge opening C13 is provided at the top section of the upper cover member C1 in a direction parallel with the axial line J1. That is, staying of air bubbles is prevented from occurrence, from the point of view, the membranous sealing member can be lengthened its lifetime. The reason is as follows. The resist fluid within the fluid chamber R1 may contain air bubbles due to pressure decreasing function during the resist fluid sucking operation, and due to imperfect air release from the resist fluid. When air bubbles enter into or contact to the bottom section of the U-shaped turn-back section F1, local pressure change is generated at fluid contact section of the membranous sealing member F so that the U-shaped turn-back section F1 moves without holding uniform surface condition. Therefore, ablation and crack are generated in the U-shaped turn-back section F1, and those become greater factors for shortening the lifetime of the membranous sealing member F.

When the membranous sealing member F is broken due to factors such as degradation over time and the like, the fluid detection sensor D provided within the vacuum chamber R2 detects leakage of resist fluid, the control device 3 controls the first opening and closing valve 11 into closed condition immediately based upon detection signal of the fluid detection sensor D, so that application operation is temporarily interrupted. Therefore, it is prevented from occurrence that the vacuum pump 9 sucks leaked resist fluid. In the ferrule driving step S5, the ferrule driving device 7 first drives the ferrule 6 to adjacent position with respect to a glass substrate K, then drives the ferrule 6 from application beginning position X1 towards application finishing position XE at a constant speed. In this bout, resist fluid exudes from the slit-shaped opening section 621, and the resist fluid is applied on the surface of the glass substrate K with the movement of the ferrule 6. When application has finished, the ferrule 6 is stopped at the application finishing position XE, and the second opening and closing valve 12 is made to be closed condition. Then, the moving direction of the ferrule 6 is reversed, and is stopped upon reaching to a waiting position X0.

In the substrate passing over step S6, the glass substrate K is released from sucking and holding by destroying vacuum within the sucking hole (small though holes) of the stage 5. Then, lift pins are elevated so that the glass substrate K having finished application is passed over to a robot (not illustrated). Thereafter, a new glass substrate K is received from a robot, and application operations similar to the above procedure is carried out until application for a scheduled number of glass substrates has finished ("Yes" at step S7).

In the foregoing, description was made for embodiments of the invention. The embodiments disclosed above are merely exemplification, and the scope of the invention is not limited to those embodiments. The scope of the present invention is represented by the representation of claims. And, it is intended that all modification within equivalent meanings and scope of claims.

What is claimed is:

1. An applicator device comprising:
   a reservoir tank being configured to trap embrocation;
   a stage being configured to hold a substrate to which embrocation is applied;

a ferrule having a slit-shaped opening section and being installed above the stage;

a fluid transfer pump being configured to guide the embrocation within the reservoir tank to the ferrule by carrying out suction and discharge operations alternately, the fluid transfer pump having a cylinder having a suction opening and a discharge opening, a plunger provided within the cylinder in a reciprocable manner along an axial line of the cylinder, a membranous sealing member being configured to seal a gap between the cylinder and the plunger, the membranous sealing member being made of a cap-shaped member made of flexible material, and a plunger driving section being configured to drive the plunger, the plunger being covered by a body section of the cap-shaped member such that an opening edge section of the cap-shaped member is fixed on the inner peripheral face of the cylinder, the gap between the cylinder and the plunger being sealed by a U-shaped turn-back section being formed by downwardly turning back the membranous sealing member within the gap;

a first opening and closing valve disposed between the suction opening of the fluid transfer pump and the reservoir tank and being in an opened condition when the suction operation is carried out and being in a closed condition when the discharge operation is carried out;

a second opening and closing valve disposed between the discharge opening of the fluid transfer pump and the ferrule and being in an opened condition when the discharge operation is carried out and being in a closed condition when the suction operation is carried out;

a driving device being configured to move relatively the ferrule and/or substrate to one another under a condition where the slit-shaped opening section and the substrate are adjacent to one another;

a vacuum pump being connected to a chamber of the cylinder, the chamber being arranged not to contact fluid; and a positive pressure imparting device being configured to impart a predetermined positive pressure within the reservoir tank.

2. An applicator device as set forth in claim 1, wherein the plunger driving section drives the plunger so as to determine a moving speed of the plunger when the suction operation is carried out, to be lower than a moving speed of the plunger when the discharge operation is carried out.

3. An applicator device as set forth in claim 1, wherein the plunger driving section drives the plunger so as to determine a time-speed relationship at an acceleration beginning stage of the plunger P under suction operation to be a near S-curve shape.

4. An applicator device as set forth in claim 1, wherein the discharge opening is provided at the top section of the cylinder of the fluid transfer pump, and is used in a standing condition where the axial line of the cylinder is in parallel with a vertical axis.

5. An applicator device as set forth in claim 1, further comprising an embrocation detection sensor that detects embrocation leaked through the membranous sealing member, wherein the first opening and closing valve is operated to be closed condition in response to a detection signal from the embrocation detection sensor.

6. An applicator device as set forth in claim 1, wherein the chamber of the cylinder has a vacuuming opening to which piping is connected, and the vacuum pump is connected to the chamber via the piping and vacuuming opening.

* * * * *